United States Patent
McRae

(10) Patent No.: US 9,356,204 B2
(45) Date of Patent: May 31, 2016

(54) USING QUANTUM DOTS FOR EXTENDING THE COLOR GAMUT OF LCD DISPLAYS

(71) Applicant: Vizio Inc, Irvine, CA (US)

(72) Inventor: Matthew Blake McRae, Irvine, CA (US)

(73) Assignee: Vizio Inc, Irvine, CA (US)

( * ) Notice: Subject to any disclaimer, the term of this patent is extended or adjusted under 35 U.S.C. 154(b) by 0 days.

(21) Appl. No.: 14/098,225

(22) Filed: Dec. 5, 2013

(65) Prior Publication Data

US 2015/0162507 A1    Jun. 11, 2015

(51) Int. Cl.
*H01L 33/00* (2010.01)
*H01L 33/50* (2010.01)

(52) U.S. Cl.
CPC .............. *H01L 33/505* (2013.01); *H01L 33/502* (2013.01)

(58) Field of Classification Search
CPC ......... H01L 29/06; H01L 33/00; H01L 33/20; H01L 33/69
See application file for complete search history.

(56) References Cited

U.S. PATENT DOCUMENTS

| | | | |
|---|---|---|---|
| 7,481,562 B2 * | 1/2009 | Chua et al. .................... 362/612 |
| 8,360,617 B2 | 1/2013 | Gillies et al. | |
| 8,362,507 B2 | 1/2013 | Weber | |
| 8,455,898 B2 | 6/2013 | Anc | |
| 2003/0042850 A1 | 3/2003 | Bertram et al. | |
| 2006/0163560 A1 | 7/2006 | Choi | |
| 2009/0134414 A1 * | 5/2009 | Li et al. ............................ 257/98 |
| 2009/0221106 A1 * | 9/2009 | Zimmerman et al. .......... 438/29 |
| 2010/0193806 A1 * | 8/2010 | Byun .................... H01L 33/507 257/88 |
| 2012/0248479 A1 | 10/2012 | Anc | |
| 2013/0056706 A1 | 3/2013 | Baxter | |
| 2013/0070450 A1 | 3/2013 | Horn | |
| 2013/0099212 A1 * | 4/2013 | Jang et al. ....................... 257/40 |

FOREIGN PATENT DOCUMENTS

| | | |
|---|---|---|
| WO | WO2012060648 | 5/2012 |
| WO | WO2013020415 | 2/2013 |

\* cited by examiner

*Primary Examiner* — Kyoung Lee

(57) ABSTRACT

A light emitting diode system, with an LED junction, energized to emit light, and a lens cap, covering the LED junction device and receiving the light. The lens cap can be formed in a shape to focus the light, for example. The material forming the lens cap has quantum dots mixed in with the supporting material, which can be in multiple colors. The supporting material can also have particles of glass or other crystalline material mixed therein. There can also be an outer casing over the supporting material, and the outer casing can also have glass or other crystalline particles mixed in.

23 Claims, 6 Drawing Sheets

Quantum dot lens cap with blue LED

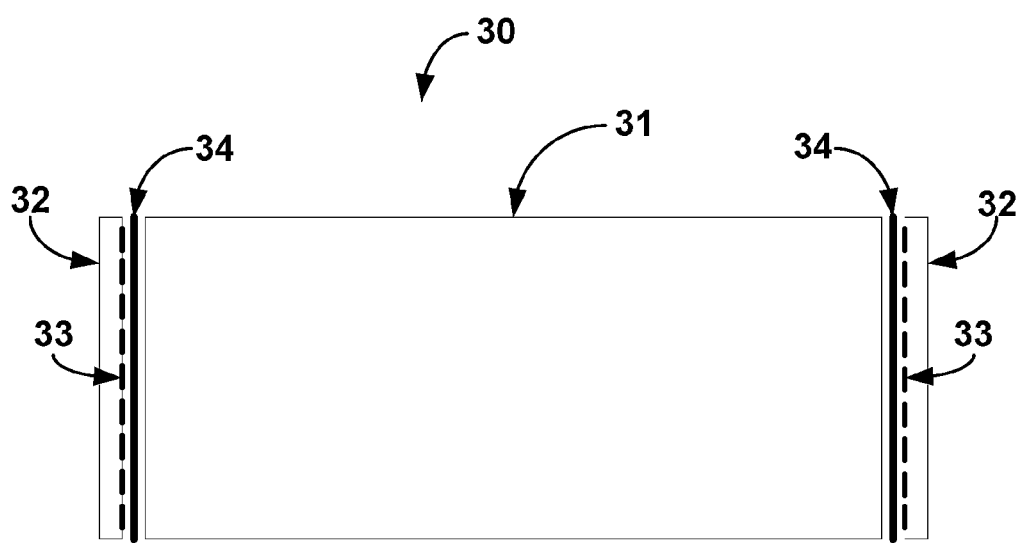
Figure 5 – Prior Art Quantum dot edge lit backlight assembly

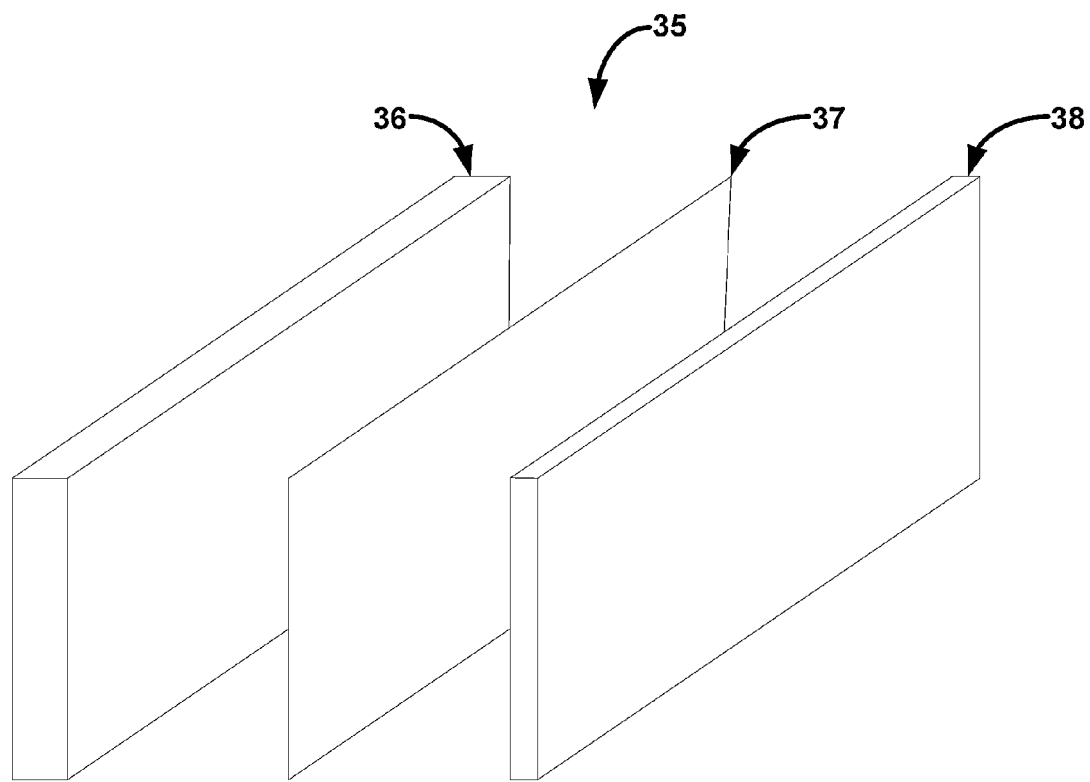
Figure 6 – Prior Art Quantum dot diffuser film assembly

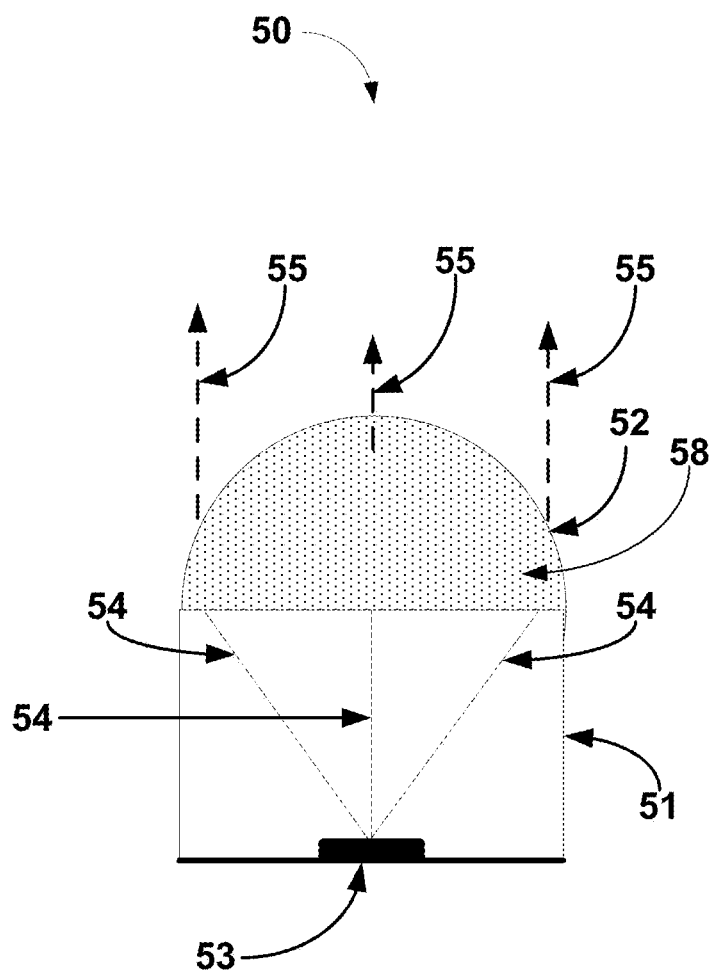
Figure 7 – Quantum dot lens cap with blue LED

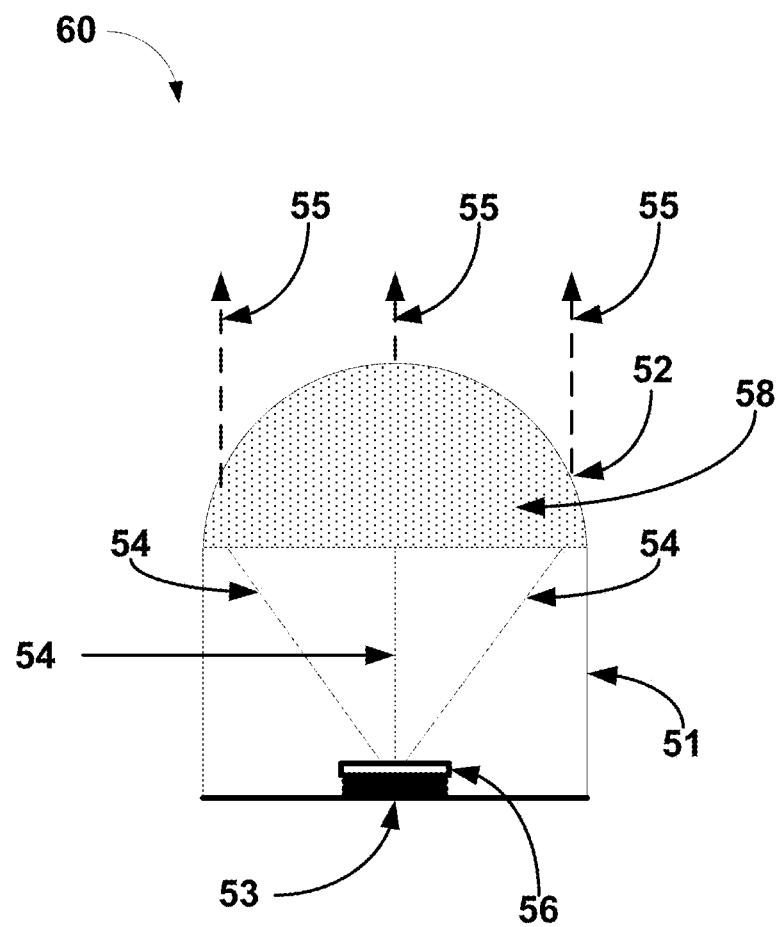
Figure 8 – Quantum dot lens cap with phosphor coated LED

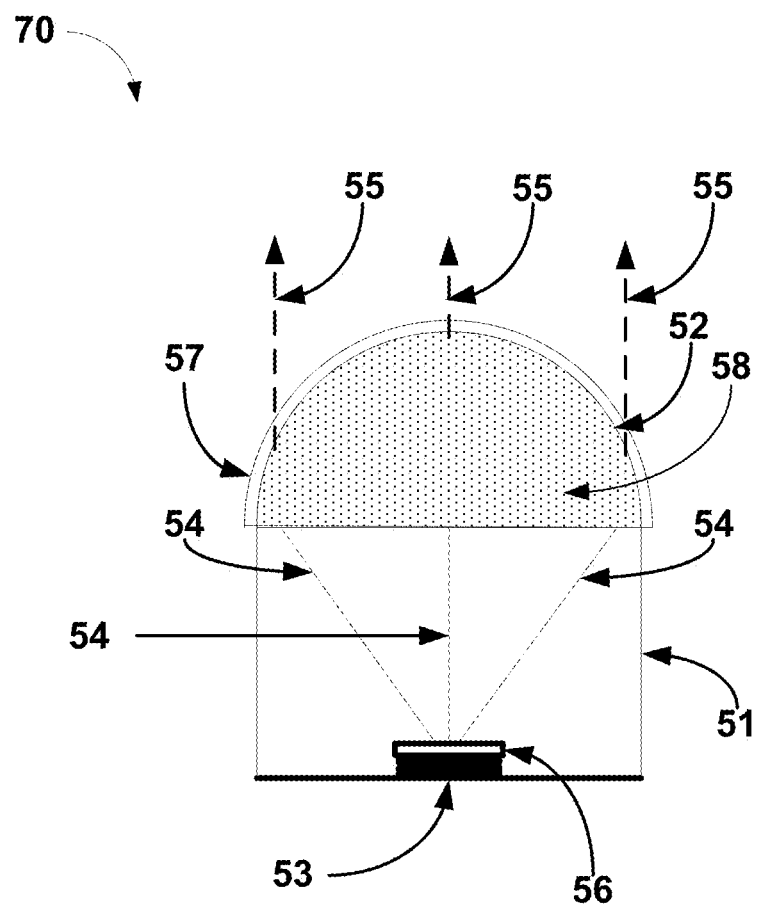
Figure 9 – Quantum dot lens cap with sealing coat and phosphor coated LED

USING QUANTUM DOTS FOR EXTENDING THE COLOR GAMUT OF LCD DISPLAYS

BACKGROUND

LCD display panels have under gone several evolutions, especially in backlighting technology, since their introduction for use in television and computer monitors.

Cold Cathode Fluorescent Lamps (CCFL): CCFL backlighting was the dominant lighting technology when LCD displays were first mass produced. Generally two CCFLs were placed at opposite edges of the display. A diffuser and two polarizers spread the light out evenly across the back of the display. Unlike white LEDs, CCFLs have an even-white spectral output resulting in better color gamut for the display. CCFLs however are substantially less energy efficient than LEDs and require costly electronics to convert whatever voltage the television or monitor uses (typically 5 or 12 v) to the high voltage needed to light a CCFL. The voltage conversion is normally performed using an inverter. The thickness of the inverter transformer also limits how thin the display can be made.

Edge Lit—White LED: The LCD panel is lit by a row of white LEDs placed at one or more edges of the screen. Like CCFLs, this technology requires a light diffuser to spread the light evenly across the whole display. The color gamut of white LEDs is less than that found in CCFL backlighting.

Array Lit—White LEDs: The LCD panel is lit by a full array of white LEDs placed behind a diffuser behind the LCD panel. LCD displays that use this implementation will usually have the ability to dim the LEDs in the dark areas of the image being displayed, effectively increasing the contrast ratio of the display. As of 2012, this design gets most of its use from LCD televisions. The color gamut of this implementation is the same as that in edge lit with white LEDs.

Array Lit—RGB-LED: This backlighting technology is similar to the Array Lit with white LEDs, except the panel is lit by a full array of RGB LEDs. While displays lit with white LEDs usually have a poorer color gamut than CCFL lit displays, panels lit with RGB LEDs have very wide color gamuts. This implementation is very costly and most popular on professional graphics editing LCD displays.

Technology to improve the color gamut in LCD display panels is also an ongoing effort. CCFL lighting provides better color gamut than LED lighting but has the disadvantage of substantially higher cost. White LEDs cannot provide a pure white light. In an attempt to improve the spectral output of LEDs the lens of a blue light emitting LED is coated with a yellow phosphor which then emits a whiter light. Another approach called remote phosphor is coats the lens of an ultraviolet emitting LED with a phosphor which then emits a whiter light. Other approaches to improve the color gamut of the backlight have not been used in production because of cost or difficulty in manufacturing process.

The color gamut of backlighting technology is a tradeoff between acceptable colors displayed to the viewer and manufacturing process and cost.

Recently a new technology has been developed. This technology is based on Quantum Dots (QD) which is semiconductor nano size crystals that emit light of specific wavelengths when stimulated with light.

This display technology is similar to organic light-emitting diode (OLED) displays. One of the advantages of QDs is that they emit very pure light. For example, the frequency of light emitted from any given QD is dependent on the width of the QD crystal. A QD that is approximately 7 nanometers (nm) in diameter will, when stimulated with blue light, emit red light. Because a group of QDs "tuned" for red light emission will all not be exactly 7 nm, slightly different frequencies or wavelengths centered around what is emitted by a QD that is exactly 7 nm will be emitted. The result is red light emitted with a peak wavelength of what would be emitted by a 7 nm crystal. The light will be, for all intents and purposes, pure red light which will appear to a viewer as a saturated red. For QD crystals that are approximately 3 nm, the emitted light will appear to be a saturated green color.

Quantum dots incorporate the best aspects of both organic light emitters and inorganic light emitters (LEDs). With many promising advantages, QD LED or QLED is considered as a next generation display technology which is still several years off.

Some companies have introduced technology which uses films with red and green quantum dots embedded into the film. This film is then back lit with blue light typically emitted by blue LEDs. The quantum dots fixed to the film will, when stimulated by blue light will in turn emit red and green light and will pass some amount of blue light around the quantum dots as scattered blue light. The resultant white light (red, blue and green) will mix and appear as pure white light at the back of the color film/LCD.

The use of color filter film on the back surface of LCD display panels is well known in the art. These films have colored dots of red, blue and green printed or deposited on the film. The dots are arranged on the film such that when the film is applied to the back of a LCD display panel they are aligned such that each dot is directly over the area where a matching pixel gate is positioned within the LCD panel itself.

SUMMARY

The use of color filter films allows a single white light source to be used for providing light to the LCD panel. A problem however with this scheme is that alignment of the color dots on the film is extremely critical and aligning and adhering the film to the back surface of the LCD panel has to be very precise so that the color dots are each covering a matching pixel.

An embodiment uses quantum dots, referred to herein as QDs, located inside the lens of blue LEDs to create "white" light delivered to the back of the color film and! or the LCD panel of a television.

In a preferred embodiment, red and green quantum dots will be mixed into the material that forms the lens cap that sits on top of a LED. The resulting matrix operates when stimulated at the back surface with blue light, to emit a mixture of red and green light with blue light which will appear as white light. The lens then focuses and steers the resultant white light to the back of the LCD panel or to the color filter film.

In another embodiment, the quantum dot matrix may also include glass or other crystalline crystals to enhance the scattering of blue light through the lens matrix.

In another embodiment, blue light emitting phosphorus is coated onto the actual LED junction. In this embodiment the LED may emit a UV light that will, after stimulating the phosphorus, emit a pure blue light. This blue light will further stimulate the red and green QDs suspended within the polycarbonate lens which in turns causes the red and green QDs to emit a saturated red and green light. Some blue light from the phosphorus coated LED passes through the lens from the scattering effect.

In another embodiment the same material as used in the lens may be used for a coating over the lens to improve the optical qualities and focusing of the light being emitted by the lens.

In another similar embodiment, the coating material may contain glass or other crystalline crystals to improve scattering of the light emitted by the quantum dot lens.

In another similar embodiment, the glass or other crystalline crystals in the embodiment described above may be blue in color to enhance the blue light emitted by the LED junction and the phosphorus coating of embodiment 3.

BRIEF DESCRIPTION OF THE DRAWINGS in the drawings:

FIG. 1 is a prior art depiction of a normal LED.

FIG. 5 is a depiction of an embodiment of the invention in where a blue light LED stimulates a quantum dot filled lines causing the output light radiation from the lens to be white.

FIG. 6 is a depiction of an embodiment of the invention in where a blue light LED with a phosphorus coating emitting a blue light stimulates a quantum dot filled lens causing the output light radiation from the lens to be white.

FIG. 7 is a depiction of an embodiment of the invention in where a blue light LED with a phosphorus coating emitting a blue light stimulates a quantum dot filled lens with a optically clear coating enhancing the white output light radiated from the lens.

FIG. 8 is a depiction of an embodiment of the invention in where a blue light LED with a phosphorus coating emitting a blue light stimulates a quantum dot filled lens causing the output light radiation from the lens to be white.

FIG. 9 is a depiction of an embodiment of the invention in where a blue light LED with a phosphorus coating emitting a blue light stimulates a quantum dot filled lens with a optically clear coating enhancing the white output light radiated from the lens.

DETAILED DESCRIPTION

Figure 1:
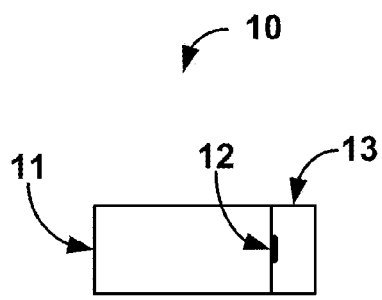
FIG. 1 is

Now referencing FIG. 1 where 10 depicts a typical LED and the support structure that holds LED junction 12. In this depiction, support structure 11 holds LED junction 12. Lens cap 13 protects LED junction 12 and may contain a lens geometry to steer light emitted by LED junction 12.

Figure 2:
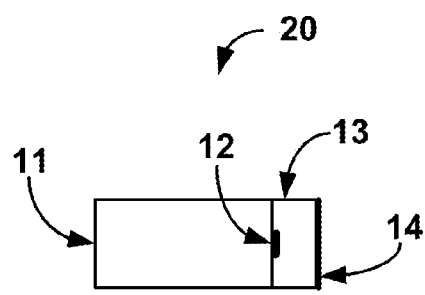
FIG. 2 is a prior art depiction of a normal LED with a yellow phosphor coating that will emit white light.

Now referencing FIG. 2 where 20 depicts the same LED as depicted in FIG. 1 with the exception that lens cap 13 is coated with a colored phosphor 14. The color of colored phosphor 14 will be picked so that light at a specific wavelength is emitted by colored phosphor 14. For example, LED Junction 12 may emit ultraviolet light and will stimulate color phosphor 14 to emit white light if color phosphor 14 is yellow.

Figure 3:
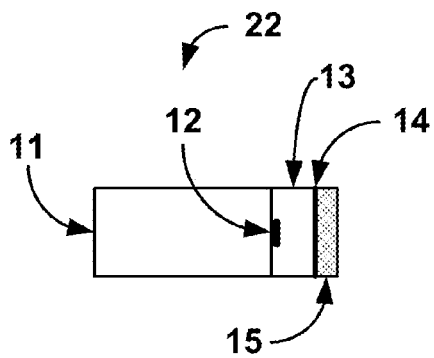
FIG. 3 is a prior art depiction of an LED using quantum dots.

Now referencing FIG. 3 where 22 depicts the same LED as depicted in FIG. 1 with the exception that color phosphor 14 is colored to emit blue light and quantum dots 15 are selected such that the diameter of the dots is approximately 7 nm. These dots will, when stimulated by blue light, re-emit red light.

The quantum dots 15 may also be formed of 7 um dots (red) and 3 um dots (green) and the density of the quantum dots may be such that some of the blue light from the LED/phosphor coating will pass around quantum dots 15 so that the resulting light is white as a mixture of the red, green, and blue.

Figure 4:
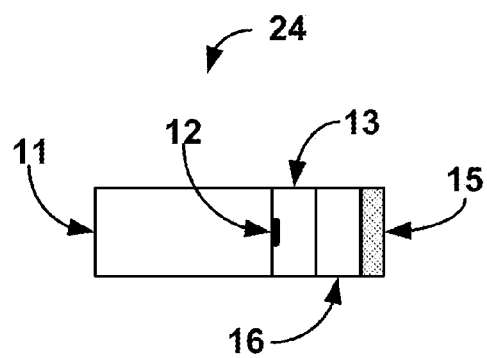
FIG. 4 is a prior art depiction of a normal LED with a yellow phosphor coating followed by a quantum dot coating.

Now referencing FIG. 4 where 24 depicts the same LED as depicted in FIG. 1 with the exception that color phosphor 14 is colored to emit blue light and quantum dots 15 are selected such that the diameter of the dots is approximately 3 um which will, when stimulated by blue light re-emit green light. The quantum dots 15 may also be formed of 7 um dots (red) and 3 um dots (green) and the density of the quantum dots may be such that some of the blue light from the LED/phosphor coating will pass around quantum dots 15 so that the resulting light is white (red, green, blue).

Now referencing prior art FIG. 5 where 30 depicts an edge lit light guide 31. In this depiction, edge lit light guide 31 will have structures, generally pyramids acting as prisms, embedded into the back surface that will redirect light emitted by LEDs 33 approximately 90 degrees such that the light will exit out the front surface of edge lit light guide 31. In this depiction LEDs 33 will emit blue light through quantum dot film 34. The resulting light entering edge lit light guide 31 will be a mixture of red, green and blue. Edge support structure 32 supports LEDs 33. The light emitted out of the front surface of edge lit light guide 31 will contain saturated colors of red, green and blue resulting in a white light.

Now referencing prior art FIG. 6 where 35 depicts a quantum dot film 37 which may be used in place of or in conjunction with a normal diffuser panel. In the depiction backlight assembly 36 emits blue light from the front surface. The blue light enters quantum dot film 37 stimulating red and green quantum dot crystals embedded in the film. Quantum dot crystals stimulated by the blue light will emit either saturated red or green light. Some blue light will pass through the film without striking any of the quantum dot crystals and emerge from the front surface of the film along with the saturated red and green light which when mixed results in a white light. The combined light will then enter LCD panel 38. LCD panel 38 includes a color filter film covering the LCD sub pixel gates which filters individual colors of light such that only red light is passed through the red sub pixels and green light is passed through the green sub pixels and blue light is passed through the blue sub pixels.

Now referencing FIG. 7 where 50 depicts a LED diode 53 with a supporting structure 51 and a lens cap 52 whose shape will act to focus emitted light and scattered light 55 in a specific pattern. In this depiction, 58 depicts a mixture of quantum dots which are selected to emit red and green light when stimulated by blue light 54 emitted by LED junction 53. The shape of lens 52 can be used to focus the resulting light pattern of emitted light 55. One enhancement to the lens is the addition of glass or other crystalline crystals to provide an enhanced scattering capability allowing more blue light to pass through lens 52. The size and density of the glass or other crystalline crystals will determine the scattering effect. The glass or other crystalline crystals may also be blue in color to enhance the emitted blue light which will be a component of emitted light 55.

Now referencing FIG. 8 where 60 depicts a LED diode 53 with a supporting structure 51 and a lens cap 52 whose shape will act to focus emitted light and scattered light 55 in a specific pattern. In this depiction, a phosphorus coating 56 is placed on top of LED junction 53. The makeup of phosphorus coating 56 may be such that LED junction 53 can emit ultraviolet light which stimulates phosphorus coating 56 to emit a pure blue color. In this depiction, 58 depicts a mixture of quantum dots which are selected to emit red and green light when stimulated by blue light 54 emitted by LED junction 53 and phosphorus coating 56. The shape of lens 52 can be used to focus the resulting light pattern of emitted light 55. One enhancement to the lens is the addition of glass or other crystalline crystals to provide an enhanced scattering capability allowing more blue light to pass through lens 52. The size and density of the glass or other crystalline crystals will determine the scattering effect. The glass or other crystalline crystals may also be blue in color to enhance the emitted blue light which will be a component of emitted light 55.

Now referencing FIG. 9 where lens structure 52 has a lens coating 57 laid over lens structure 52. The purpose of lens coating 57 is to improve the optical qualities of lens structure 52. In one embodiment, the lens coating can be a sealing coat. Lens coating 57 may also contain glass or other crystalline crystals whose purpose is to enhance light scattering of emitted light 55. These glass or other crystalline crystals may also be colored such as to enhance emitted light 55. The color of the glass or other crystalline crystals may be any color contained on the CIE color index.

The size of the glass or other crystalline crystals may be chosen to enhance the scattering of emitted light 55.

The matrix supporting material of lens structure 52 may be polycarbonate where the mixture of quantum dots are introduced into the polycarbonate while it is in a melted state. Thermoplastics other than polycarbonate may be used. The quantum dots can be introduced into the supporting material in a way that keeps the dots uniformly distributed or substantially uniformly distributed in the supporting material.

Optically clear epoxies may also be used for the matrix supporting structure.

The lens structure 52 may also be formed of more than one element. For example, Lens structure 52 may contain a layer made of polycarbonate where the mixture of quantum dots is contained within the polycarbonate and an outer encasing shell of the lens may be optically clear epoxy. Lens coating 57 may also be a dissimilar material than lens structure 52. For example, lens structure 52 may be polycarbonate and lens coating 57 may be optically clear epoxy.

In all of these depictions where optically clear epoxy is used for lens structure 52 or lens coating 57 the epoxy may be UV curable.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art. For example, the techniques described herein can be used with other kinds of materials, e.g., the glass or other crystalline crystals can be pieces formed of any kind of material.

Those of skill would further appreciate that the various illustrative logical blocks, modules, circuits, and algorithm steps described in connection with the embodiments disclosed herein may be implemented as electronic hardware, computer software running on a specific purpose machine that is programmed to carry out the operations described in this application, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the embodiments disclosed herein, may be controlled by a general or specific purpose processor, or with hardware that carries out these functions, e.g., a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, micro controller, or state machine. The processor can be part of a computer system that also has an internal bus connecting to cards or other hardware, running based on a system BIOS or equivalent that contains startup and boot software, system memory which provides temporary storage for an operating system, drivers for the hardware and for application programs, disk interface which provides an interface between internal storage device(s) and the other hardware, an external peripheral controller which interfaces to external devices such as a backup storage device, and a network that connects to a hard wired network cable such as Ethernet or may be a wireless connection such as a RF link running under a wireless protocol such as 802.11. Likewise, external bus 18 may be any of but not limited to hard wired external busses such as IEEE-1394 or USB. The computer system can also have a user interface port that communicates with a user interface, and which receives commands entered by a user, and a video output that produces its output via any kind of video output format, e.g., VGA, DVI, HDMI, displayport, or any other form. This may include laptop or desktop computers, and may also include portable computers, including cell phones, tablets such as the IPAD™ and Android platform tablet, and all other kinds of computers and computing platforms.

A processor may be used to operate the display, and the processor may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, using cloud computing, or in combinations. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of tangible storage medium that stores tangible, non transitory computer based instructions. An exemplary storage medium is coupled to the processor such that the processor can read information from, and write information to, the storage medium. In the alternative, the storage medium may be integral to the processor. The processor and the storage medium may reside in reconfigurable logic of any type.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Operations as described herein can be carried out on or over a website. The website can be operated on a server computer, or operated locally, e.g., by being downloaded to the client computer, or operated via a server farm. The website can be accessed over a mobile phone or a PDA, or on any other client. The website can use HTML code in any form, e.g., MHTML, or XML, and via any form such as cascading style sheets ("CSS") or other.

The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A light emitting diode system, comprising:
   an LED junction device, energized to emit light, wherein the LED junction device includes an LED device with an emitting phosphor device;
   a lens cap, covering said LED junction device and receiving said light, said lens cap being formed in a specified shape, and said lens cap formed of a supporting material that allows light to pass through said the supporting material, and where the supporting material has a plurality of quantum dots mixed in with the supporting material.

2. The system as in claim 1, wherein said quantum dots are uniformly dispersed within the supporting material.

3. The system as in claim 1, wherein said quantum dots include two different colors of quantum dots.

4. The system as in claim 1, wherein said quantum dots include three different colors of quantum dots.

5. The system of claim 1, wherein said supporting material also has particles of glass or other crystalline material mixed therein.

6. The system of claim 1, wherein the LED junction device includes a blue LED.

7. The system as in claim 1 wherein said supporting material is formed into a shape which focuses light from a plurality of different directions into a consistent direction.

8. The system of claim 1, wherein said supporting material is polycarbonate and where the plurality of quantum dots are introduced into the polycarbonate while it is in a melted state.

9. The system of claim 1, wherein said supporting material is a thermoplastic.

10. The system of claim 1, further comprising an outer encasing over said supporting material.

11. The system of claim 10, wherein said outer encasing is optically clear epoxy.

12. A light emitting diode system, comprising:
    an LED junction device, energized to emit light;
    a lens cap, covering said LED junction device and receiving said light, said lens cap being formed in a specified shape, and said lens cap formed of a supporting material that allows light to pass through said the supporting material, and where the supporting material has a plurality of quantum dots mixed in with the supporting material further comprising an outer encasing over said supporting material, wherein said outer encasing has glass or other crystalline materials mixed therein which are blue in color.

13. A light emitting diode system, comprising:
    an LED junction device, energized to emit light;
    a lens cap, covering said LED junction device and receiving said light, said lens cap being formed in a specified shape, and said lens cap formed of a supporting material that allows light to pass through said supporting material; and
    a casing material covering the supporting material, said casing material formed of a different material than the supporting material and attached to the supporting material, wherein said casing material also has particles of glass or other crystalline material mixed therein, wherein said supporting material has a plurality of different quantum dots mixed in with the supporting material, and wherein said plurality of quantum dots include multiple different colors of quantum dots.

14. The system as in claim 13, wherein said particles of glass or other crystalline material are blue in color.

15. The system of claim 13, wherein said supporting material also has particles of glass or other crystalline material mixed therein.

16. A light emitting diode system, comprising:
an LED junction device, energized to emit light;
a lens cap, covering said LED junction device and receiving said light, said lens cap being formed in a specified shape, and said lens cap formed of a supporting material that allows light to pass through said supporting material; and
a casing material covering the supporting material, said casing material formed of a different material than the supporting material and attached to the supporting material, wherein said casing material also has particles of glass or other crystalline material mixed therein, where said particles are blue in color.

17. The device as in claim 16, wherein said supporting material has a plurality of different quantum dots mixed in with the supporting material, and wherein said plurality of quantum dots include multiple different colors of quantum dots.

18. A light emitting diode system, comprising:
an LED junction device, energized to emit light;
a lens cap, covering said LED junction device and receiving said light, said lens cap being formed in a specified shape, and said lens cap formed of a supporting material that allows light to pass through said supporting material; and
a casing material covering the supporting material, said casing material formed of a different material than the supporting material and attached to the supporting material, wherein the LED junction device includes an LED device with an emitting phosphor device, wherein said supporting material is polycarbonate where the plurality of quantum dots are introduced into the polycarbonate while it is in a melted state.

19. A light emitting diode system, comprising:
an LED junction device, energized to emit light, wherein the LED junction device includes an LED device with an emitting phosphor device;
a lens cap, covering said LED junction device and receiving said light, said lens cap being formed in a specified shape, and said lens cap formed of a supporting material that allows light to pass through said the supporting material, said supporting material having both quantum dots and glass or other crystalline crystals mixed in with the supporting material.

20. The device as in claim 19, wherein both said quantum dots and said glass or other crystalline crystals are uniformly dispersed within the supporting material.

21. The system as in claim 20, wherein said quantum dots include multiple different colors of quantum dots.

22. The system of claim 19, further comprising an outer casing over said supporting material, said outer casing being of a different material than said supporting material.

23. A light emitting diode system, comprising:
an LED junction device, energized to emit light;
a lens cap, covering said LED junction device and receiving said light, said lens cap being formed in a specified shape, and said lens cap formed of a supporting material that allows light to pass through said the supporting material, said supporting material having both quantum dots and glass or other crystalline crystals mixed in with the supporting material, wherein said supporting material has glass or other crystalline materials mixed therein wherein said supporting material has a plurality of different quantum dots mixed in with the supporting material, and wherein said plurality of quantum dots include multiple different colors of quantum dots.

* * * * *